US006784729B1

(12) United States Patent
Glazewski et al.

(10) Patent No.: US 6,784,729 B1
(45) Date of Patent: Aug. 31, 2004

(54) DIFFERENTIAL AMPLIFIER WITH INPUT GATE OXIDE BREAKDOWN AVOIDANCE

(75) Inventors: Robert A. Glazewski, Austin, TX (US); Norman Bujanos, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/218,352

(22) Filed: Aug. 14, 2002

(51) Int. Cl.$^7$ ......................................... H03K 19/0185
(52) U.S. Cl. .................................... 327/566; 327/562
(58) Field of Search ................................ 327/543, 562, 327/437, 560, 561, 563, 530, 306, 309

(56) References Cited

U.S. PATENT DOCUMENTS 3,879,640 A * 4/1975 Schade, Jr. .................. 317/31
5,016,014 A * 5/1991 Bitting ......................... 341/162
5,616,945 A * 4/1997 Williams ...................... 257/365
5,736,869 A * 4/1998 Wei .............................. 326/81

* cited by examiner

*Primary Examiner*—Dinh T. Le
(74) *Attorney, Agent, or Firm*—Zagorin, O'Brien & Graham, LLP

(57) ABSTRACT

A differentail amplifier with input gate oxide breakdown avoidance amplifies a difference between two signals while maintaining voltage drops across transistor utilized in the differential amplifier to below a gate oxide breakdown level. A pull up structure added to a traditional differential amplifier allows the circuit to be utilized in IO pads of an integrated circuit and to be composed of thin oxide transistor normally only found in the core circuitry of the integrated circuit and. The pull up structure is composed of three thin oxide transistors, the first transistor is connected in series with the other two, and the other two connected in parallel with respect to each other.

21 Claims, 9 Drawing Sheets

| $V_{DD}$ | $V_{SS}$ | VREF | DIN | Node A | Node B | Node C | RESULT | REASON |
|---|---|---|---|---|---|---|---|---|
| 1.2 V | 0 V | 1.65 V | 0 V | 647 mV | 735 mV | 0 V | BREAKDOWN T204 | VOLTAGE DROP FROM VREF TO Node C = 1.65 V |
| 1.2 V | 0 V | 0 V | 1.65V | 0.1 mV | 1.2 V | 1.2 V | BREAKDOWN T202 | VOLTAGE DROP FROM DIN TO Node A = 1.55 V |
| 1.2 V | 0 V | 0 V | 0 V | 604 mV | 679 mV | 604 mV | No Breakdown | |
| 1.2 V | 0 V | 1.65 V | 1.65 V | 0.1 mV | 1.2 V | 0.1 mV | BREAKDOWN T202 and T204 | VOLTAGE DROP FROM DIN TO Node A = 1.55 V and VOLTAGE DROP FROM VREF TO Node C = 1.55 V |

FIG. 2B

| $V_{DD}$ | $V_{SS}$ | VREF | DIN | Node A' | Node B' | Node C' | RESULT |
|---|---|---|---|---|---|---|---|
| 1.2 V | 0 V | 1.65 V | 0 V | 647 mV | 735 mV | 352 mV | No Breakdown |
| 1.2 V | 0 V | 0 V | 1.65V | 488 mV | 1.16 V | 1.15 V | No Breakdown |
| 1.2 V | 0 V | 0 V | 0 V | 607 mV | 680 mV | 607 mV | No Breakdown |
| 1.2 V | 0 V | 1.65 V | 1.65 V | 477 mV | 1.2 V | 477 mV | No Breakdown |

DIFFERENTIAL AMPLIFIER WITH INPUT GATE OXIDE BREAKDOWN AVOIDANCE

BACKGROUND

1. Field of the Invention

This invention relates to differential amplifiers and more particularly to preventing input gate oxide breakdown of transistors in a differential amplifier.

2. Description of the Related Art

Differential amplifiers, also referred to as difference amplifiers and diff amps, are useful for processing low-amplitude signals in noisy environments. In general, a differential amplifier amplifies a difference in voltage between two input signals. The differential amplifier is often a building block or sub-circuit used within high-quality integrated circuit amplifiers, linear and nonlinear signal processing circuits, and even certain logic gates and digital interfacing circuits.

As noted above, differential amplifiers can be useful in digital interfacing circuits, for example, as part of an input buffer on an integrated circuit. When implemented using metal-oxide-semiconductor (MOS) technology, field effect transistors (MOSFETs) are used to form the differential amplifier. MOS transistors are either of the p-channel type (PMOS) or n-channel type (NMOS). Complementary-symmetry MOS (CMOS) technology uses both PMOS and NMOS transistors. MOS transistors have very high input impedance and consume little static power. This makes them quite useful in the design of micro-power circuits, both digital and linear. In addition, MOS transistors are also very useful in the design of amplifiers due to their extremely high input impedance.

Although quite useful, MOS transistors have a tendency to breakdown when a voltage drop across the device exceeds a process dependent level. Breakdown of a MOSFET causes permanent damage to the oxide. Typically, breakdown can occur when the voltage drop across the gate and any other node (drain, source, bulk) exceeds the nominal process voltage by 10%. For example, if the core voltage of an integrated circuit is 1.2 volts (V), a drop of 1.32 V across the gate and the drain of a transistor causes the gate oxide of the transistor to break down and the transistor to have permanent damage.

The voltage of the internal functionality of an integrated circuit, often referred to as the core voltage, often differs from external bus signals. This often happens as integrated circuits, for example, microprocessors, step down or shrink the process, lowering the required core voltage from a higher voltage, while the rest of the system components continue to run at the higher voltage.

Rather than requiring systems to conform to a single voltage level, the input pads of integrated circuits are often designed to prevent oxide breakdown. To avoid oxide breakdown, differential amplifiers in the input pads have been designed to handle large voltage differences between core and input signal voltage levels utilizing large transistors with thick gate oxide layers. In addition, a large number of transistors operating at multiple voltage levels are added to the differential amplifiers. These solutions create large areas of circuitry, increasing the size of the integrated circuit and thus increasing the cost of manufacturing. A cheaper solution is needed.

SUMMARY

Accordingly, in one embodiment, a differential amplifier with input gate oxide breakdown avoidance amplifies a difference between two signals while maintaining voltage drops across transistors utilized in the differential amplifier to below a gate oxide breakdown level. A pull up structure allows the circuit to be utilized in IO pads of an integrated circuit and to be composed of thin oxide transistors normally only found in the core circuitry of the integrated circuit. The pull up structure is composed of three thin oxide transistors, the first transistor is connected in series with the other two, and the other two connected in parallel with respect to each other. The pull up structure prevents gate oxide breakdown of transistors utilized in the differential amplifier.

According to another embodiment, a differential amplifier has a first input terminal, a second input terminal, a first input transistor, and a second input transistor, wherein the first input terminal is connected to a gate node of the first input transistor and the second input terminal is connected to the gate node of the second input transistor. A pull-up circuit is coupled to a drain node of the first input transistor and a drain node of the second input transistor.

According to another embodiment, an integrated circuit has a means for amplifying a difference between a first and a second input signal and a means for maintaining a voltage drop across a transistor used in the means for amplifying to less than a gate oxide breakdown level.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 2A–2B illustrate an exemplary differential amplifier and its operation.

FIGS. 3A–3C illustrate a differential amplifier and its operation according to an embodiment of the present invention.

The use of the same reference symbols in different drawings indicates similar or identical items.

DESCRIPTION OF THE PREFERRED EMBODIMENT(S)

The described invention is a preferred embodiment of an improved differential amplifier that avoids gate oxide breakdown when transistors in the circuit are DC biased.

Figure 1A:
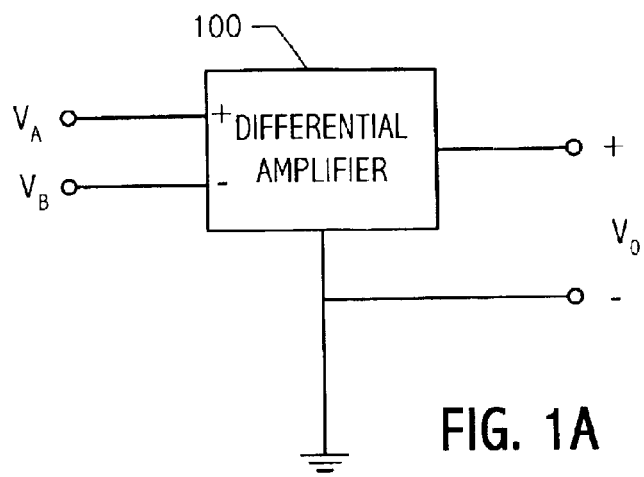
FIGS. 1A–1C illustrate common components of integrated circuits.

Referring to FIG. 1A, a differential amplifier 100 has a ground reference and three nodes associated with signal processing. Node $V_A$ is a non-inverting input, node $V_B$ is an inverting input, and $V_O$ is an output node. Signals enter differential amplifier as a pair of node voltages $V_A$ and $V_B$. A difference mode component of difference amplifier 100 is defined as $V_D=V_A-V_B$. A common mode component is defined as $V_C=(V_A+V_B)/2$. Differential amplifier 100 performs the operation: $V_O=A_D*V_D+A_C*V_C$ where $A_D$ is the difference mode gain and $A_C$ is the common mode gain. The difference mode component is useful information to be amplified and the common mode component is an undesired element such as noise. Differential amplifier 100 is therefore designed so that $A_D$ is large, usually much greater than one, and $A_C$ is small, often less than one.

Figure 1B:
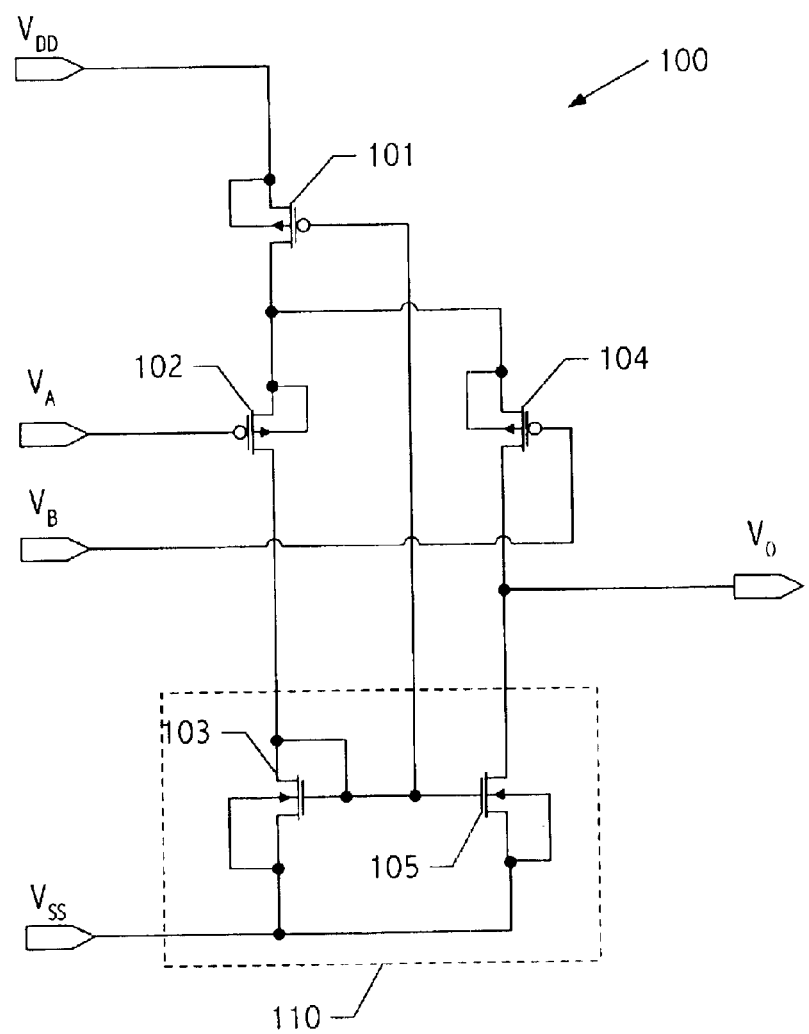

FIG. 1B illustrates an exemplary implementation of differential amplifier 100 using thin oxide enhancement mode MOS transistors that are normally in an OFF state. "Thin oxide" refers to the thickness of the gate oxide of the transistor. The actual thickness is process dependent, however, for any given process, there is a nominal gate oxide thickness. Most transistors in the core logic of an integrated circuit are thin oxide transistors. Because gate breakdown voltage is proportional to the gate oxide thickness, increasing its gate oxide thickness increases the transistor's gate oxide breakdown voltage. Thick oxide transistors are generally found in input/output (IO) cells that operate at voltages greater than the process's nominal voltage. In addition to a higher gate breakdown voltage, thick oxide transistors typically have longer than minimum channel lengths and elevated voltage thresholds.

Differential amplifier 100 amplifies the difference between inputs $V_A$ and $V_B$ and reflects the result on output $V_O$. Power $V_{DD}$ is connected to the source node of a PMOS transistor 101. $V_{DD}$ is, for example, the core voltage or supply voltage of an integrated circuit. Input $V_A$ is connected to the gate node of a PMOS transistor 102. Input $V_B$ is connected to the gate node of a PMOS transistor 104. Ground $V_{SS}$ is connected to the source nodes of NMOS transistors 103 and 105. The source nodes of transistors 102 and 104 are connected together and to the drain node of transistor 101. The drain node of transistor 102 is connected to the drain node and gate node of transistor 103. The drain node of transistor 104 is connected to the drain node of transistor 105. Output $V_O$ is connected to the drain nodes of transistor 104 and 105. Note that here the ground portion of output $V_O$ is not illustrated, but inferred.

As illustrated, transistors 103 and 105 are connected to form a current mirror 110, also referred to as a current source. Current mirror 110 provides bias currents required for active state transistor operation. Current mirror 110 is also used as an active load to increase amplifier gain. Current mirror 110 mirrors the current in transistor 103 to transistor 105.

Transistors 102 and 104 are connected to inputs $V_A$ and $V_B$ and are thus most at risk for gate oxide breakdown when the core and input signal voltages significantly differ.

The transistors described herein can be conceptualized as having a control terminal (gate) which controls the flow of current between a first current handling terminal and a second current handling terminal. An appropriate condition on the control terminal causes a current to flow from/to the first current handling terminal and to/from the second current handling terminal. Although field effect transistors (FETs) are frequently discussed as having a drain, a gate, and a source, in most such devices the drain is interchangeable with the source. This is because the layout and semiconductor processing of the transistor is frequently symmetrical. For an n-channel FET, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in n-channel FET device equations merely refers to which drain or source terminal has the lower voltage at any given point in time. For example, the source of the n-channel device of a bi-directional CMOS transfer gate depends on which side of the transfer gate is at the lower voltage. To reflect this symmetry of most n-channel FET devices, the control terminal may be deemed the gate, the first current handling terminal may be termed the "drain/source", and the second current handling terminal may be termed the "source/drain." Such a description is equally valid for a p-channel FET device, since the polarity between source and drain voltages, and the direction of current flow between drain and source, is not implied by such terminology. Alternatively, one current-handling terminal may arbitrarily deemed the "drain" and the other deemed the "source," with an implicit understanding that the two are not distinct, but interchangeable.

Figure 1C:
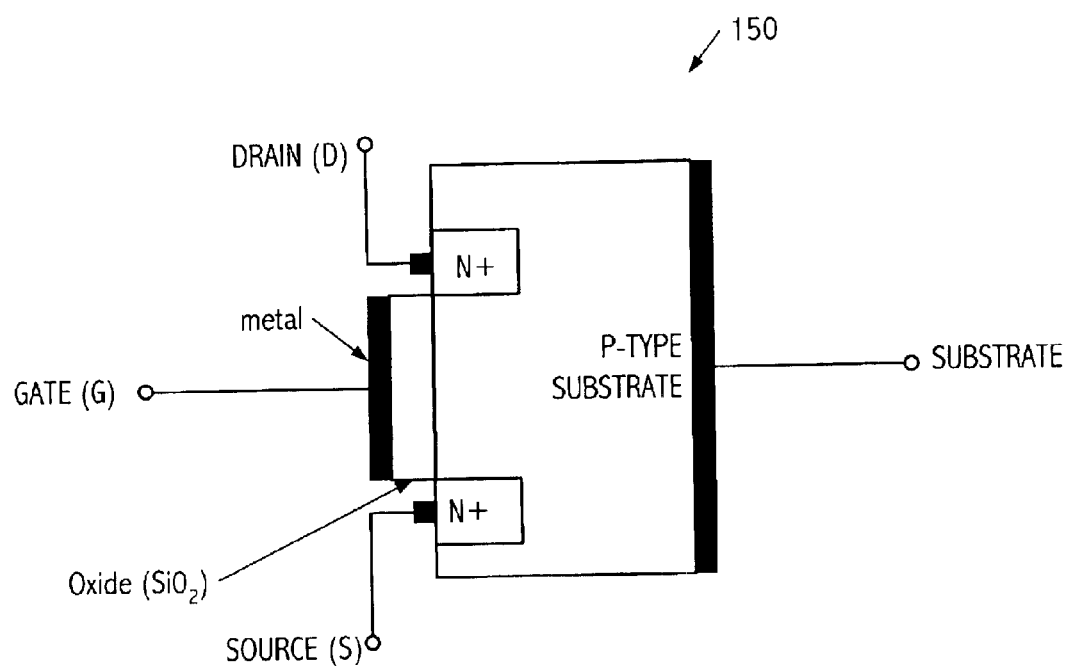

FIG. 1C illustrates an exemplary implementation of a NMOS enhancement mode transistor. As illustrated, an n-channel device is formed on a p-type silicon substrate. Two heavily doped n+ wells form low-resistance connections between the ends of the n channel and the metal contacts of the source and the drain. A thin oxide layer is grown on the surface of the channel, and metal such as polyimide is deposited on it to form the gate. The oxide layer acts as an insulator, creating a plate capacitor that causes the gate current to be negligibly small. This gives the MOS transistor its extremely high input resistance under all conditions. To avoid gate oxide breakdown, the oxide layer can be enlarged and thickened, increasing the overall size of the transistor. An implementation of a PMOS transistor, not shown, is similar to that of a NMOS transistor, except that the substrate is n-type silicon and the device utilizes doped p+ wells.

Figure 2A:
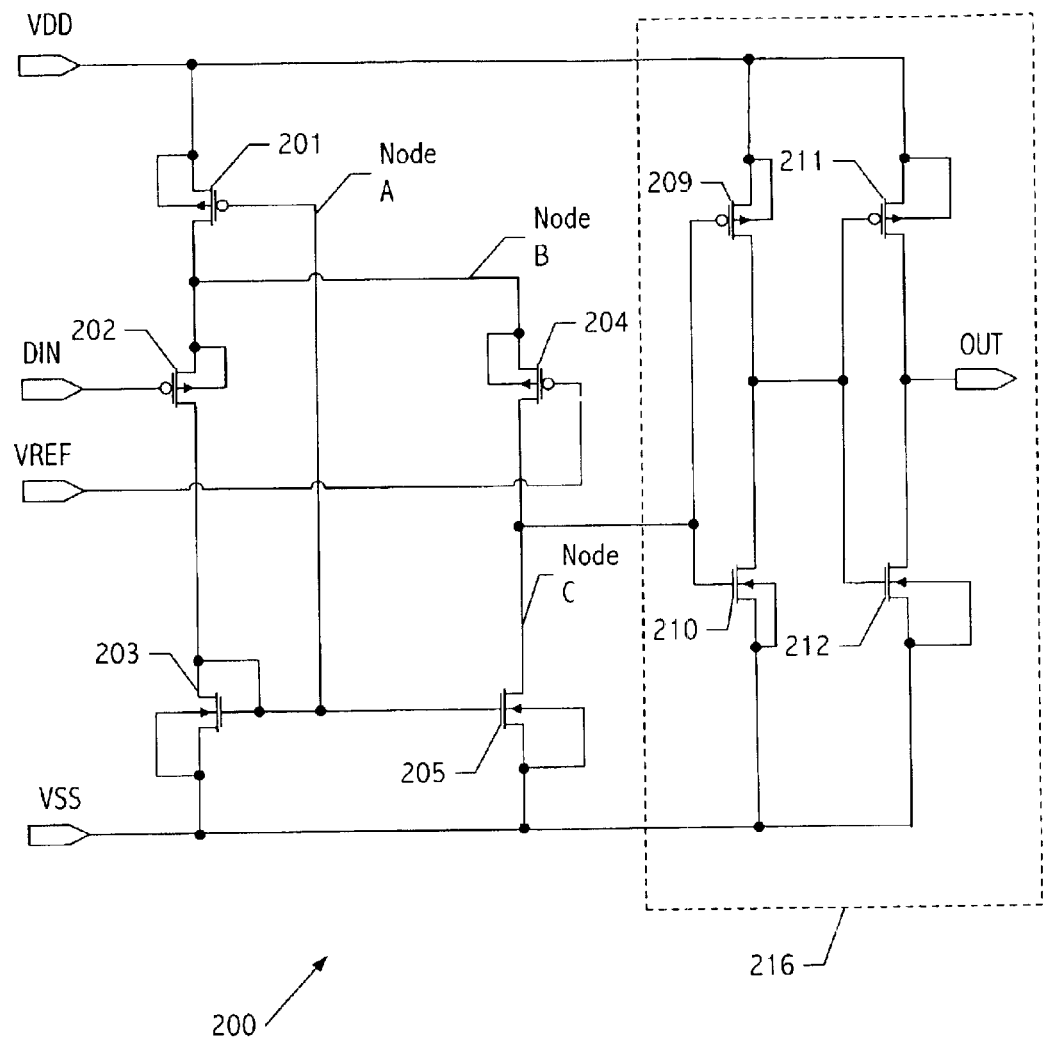

FIGS. 2A–2B illustrate another implementation of a differential amplifier. Differential amplifier 200 is similar in configuration to differential amplifier 100 using thin oxide enhancement mode transistors that are normally in an OFF state. Transistors 201, 202, 203, 204 and 205 of differential amplifier 200 are configured similar to transistors 101, 102, 103, 104 and 105 of differential amplifier 100, respectively. Inputs DIN and VREF of differential amplifier 200 correspond to inputs $V_A$ and $V_B$ of differential amplifier 100, respectively. Additional PMOS transistors 209 and 211 and NMOS transistors 210 and 212 are added forming a buffer 216. Buffer 216 further amplifies the output signal OUT, improving rise and fall times and causing the signal to swing rail-to-rail, i.e., conform to internal voltage level signaling. Power $V_{DD}$ is connected to source nodes of transistors 209 and 211. The gate nodes of transistors 209 and 210 are connected to the drain nodes of transistors 204 and 205. The drain node of transistor 209 is connected to the drain node of transistor 210 and the gate nodes of transistors 211 and 212. The source nodes of transistors 210 and 212 are connected to ground $V_{SS}$. The drain nodes of transistors 211 and 212 are connected to output OUT. Reference nodes A, B, and C are, respectively, the gate node of transistor 201, the drain node of transistor 201 and the source node of transistor 202, and the drain nodes of transistors 204 and 205.

Referring to FIG. 2B, when differential amplifier 200 is DC biased (as shown with all combinations of VREF and DIN inputs) gate oxide breakdown occurs in three cases out of four. Gate oxide breakdown voltage level for either NMOS or PMOS transistor is process dependent. Typically, it occurs when the voltage drop across the gate and any other node (drain, source, bulk) exceeds the nominal process voltage by 10%. Breakdown of a MOSFET causes permanent damage to the oxide, and therefore malfunction of the integrated circuit. In all illustrated cases, $V_{DD}$ (core voltage) is 1.2 V and $V_{SS}$ is 0 V. When VREF is 1.65 V and DIN is 0 V, the voltage drop across transistor 204 is 1.65 V. This is more than 10% greater than the core voltage and gate oxide breakdown occurs. When VREF is 0 V and DIN is 1.65 V, the voltage drop across transistor 202 is 1.55 V and gate oxide breakdown of transistor 202 occurs. When VREF is 1.65 V and DIN is 1.65 V, the voltage drop across transistor 202 is 1.55 V, the voltage drop across transistor 204 is 1.55 V, and gate oxide breakdown of both transistors occurs. The values provided in the table were produced using HSPICE simulation.

Figure 3A:
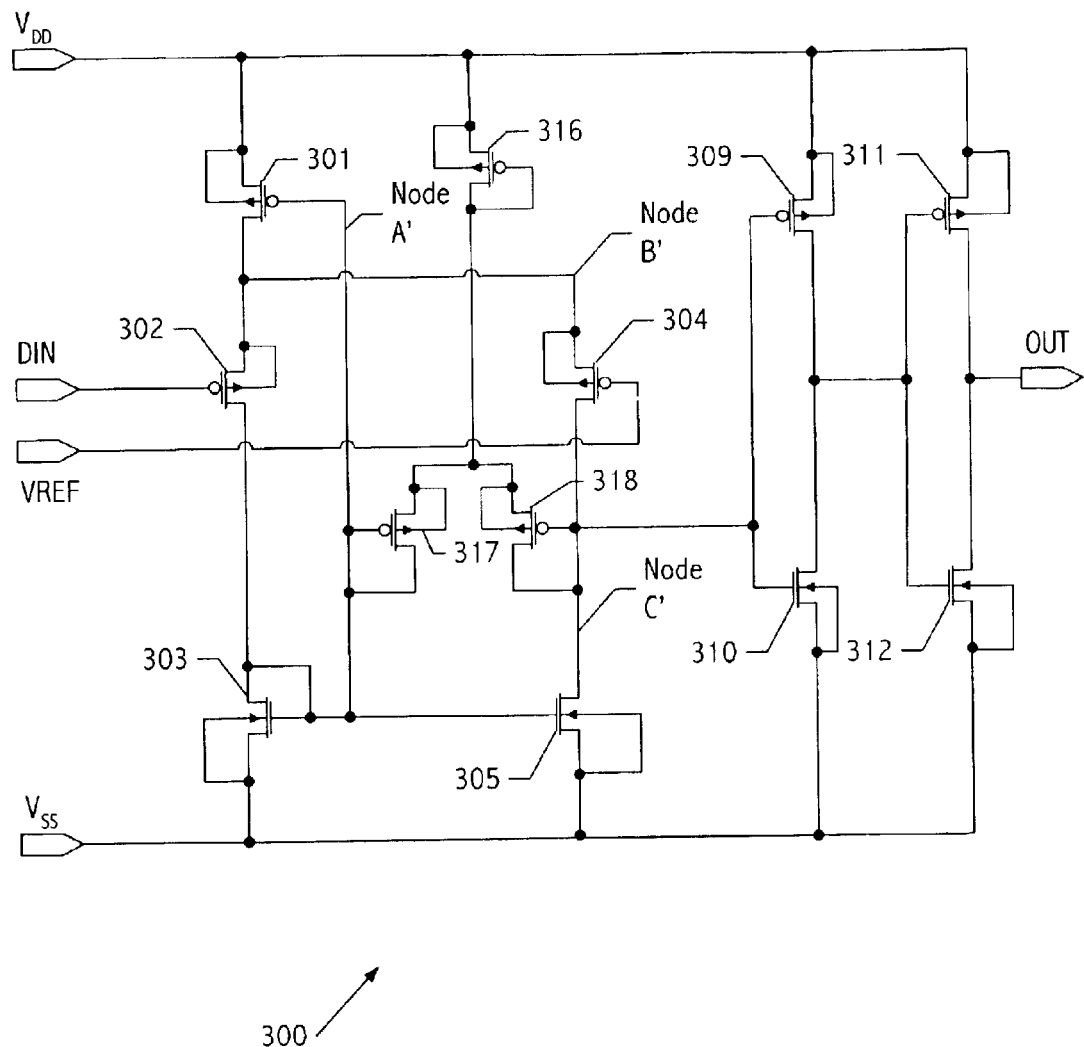
Figure 3B:
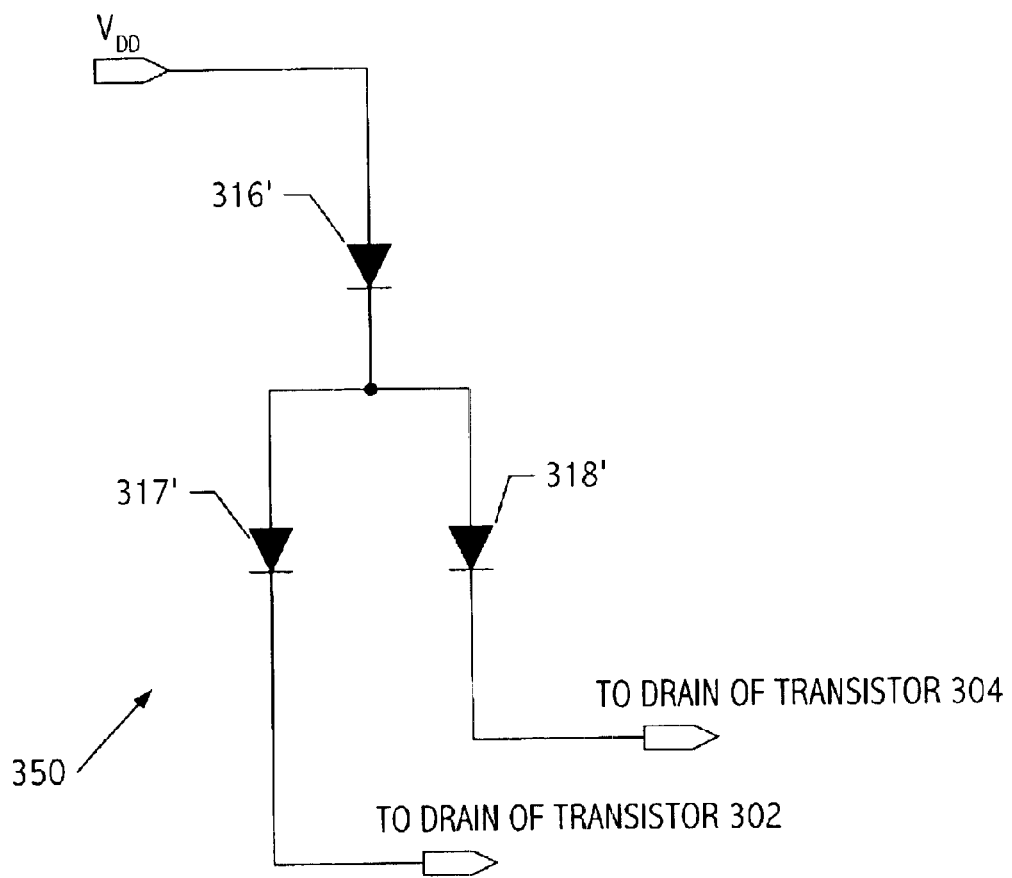

FIGS. 3A–3B illustrate a differential amplifier 300 according to an embodiment of the present invention. Differential amplifier 300 is similar in configuration to differential amplifier 200 utilizing thin oxide enhancement mode transistors that are normally in an OFF state. However, three additional PMOS transistors are added, transistors 316, 317 and 318. The source node of transistor 316 is connected to power $V_{DD}$. The gate node and drain node of transistor 316 are connected together and tied to the source nodes of transistors 317 and 318. The gate node and the drain node of transistor 317 are connected together and connected to the gate nodes of transistors 301, 303 and 305. The drain node and gate node of transistor 318 are connected together and to the drain nodes of transistors 304 and 305.

The addition of three transistors 316, 317 and 318 are in a pull-up formation and interact such that voltage drops across transistors 302 and 304 never exceeds the gate oxide breakdown level. When a transistor has its gate and drain nodes tied together, it is referred to as a diode-connected transistor and operates as a non-linear resistor. Another representation of the pull up structure is illustrated in FIG. 3B according to an embodiment of the present invention. As shown, diode-connected transistors 317' and 318' (each represented as diodes) are connected in parallel. Further, diode-connected transistor 316' (also represented as a diode) has one end connected to $V_{DD}$ and the other end connected in series with the parallel structure of diode-connected transistors 317' and 318'. This pull-up structure, with the other ends of diode-connected transistors 317' and 318' tied to drain nodes of transistors 302 and 304 respectively, prevents the gate oxide breakdown of transistors 302 and 304.

The transistors 316, 317, and 318 are connected to resemble diodes. If the voltage drop across one of these transistors is less than its threshold voltage, Vt, the transistor is in an OFF state. If the voltage drop across the transistor is more than Vt, the transistor is said to be in an ON state. Note that the current-voltage relationship for the diode is such that the current can be varied drastically with little voltage variance above Vt; therefore, the voltage across the transistor in an ON state is a little more than Vt.

Transistor 316 is in an ON state for all DC conditions, acting as a current source. Transistor 316 ensures that when transistors 317 and 318 are both biased under the same conditions, transistors 317 and 318 can each only take half of the current supplied by transistor 316. The symmetry is key. Transistors 317 and 318 are either in an ON or OFF state depending on the voltage level at Nodes A' and C', respectively. The ON/OFF states for transistors 317 and 318 are independent of each other, all four state combinations for these transistors are possible (both ON, both OFF, one ON and the other OFF, the other ON and one OFF.)

Due to the pull up structure, the voltage levels at Nodes A' and C' can never drop below ($V_{DD}$ minus the voltage drops over transistors 316 and 317) and ($V_{DD}$ minus the voltage drops over transistors 316 and 318), respectively. The value of the voltage drop is around the threshold voltage of the diode-connected transistor. Also, for that reason the voltage at Node C' can swing from $V_{DD}$ to ($V_{DD}$ minus the voltage drops over transistors 316 and 318) only, which is why buffer 216 is necessary for the rail to rail swing.

As shown in FIG. 3C, under the same DC bias conditions as for differential amplifier 200, differential amplifier 300 does not fail due to gate oxide breakdown. As shown, when VREF is 1.65 V and DIN is 0 V, the voltage at Node C' is sufficiently increased to 352 mille-volts (mV) avoiding gate oxide breakdown of transistor 204. In addition, when VREF is 0 V and DIN is 1.65 V, the voltage at Node A' is sufficiently increased to 488 mV avoiding gate oxide breakdown of transistor 202. Further, when VREF is 1.65 V and DIN is 1.65 V, the voltage at Node A' and Node C' is sufficiently increased to 477 mV and 477 mV, respectively, avoiding gate oxide breakdown of transistors 202 and 204. The values provided in the table were produced using HSPICE simulation.

Figure 4:
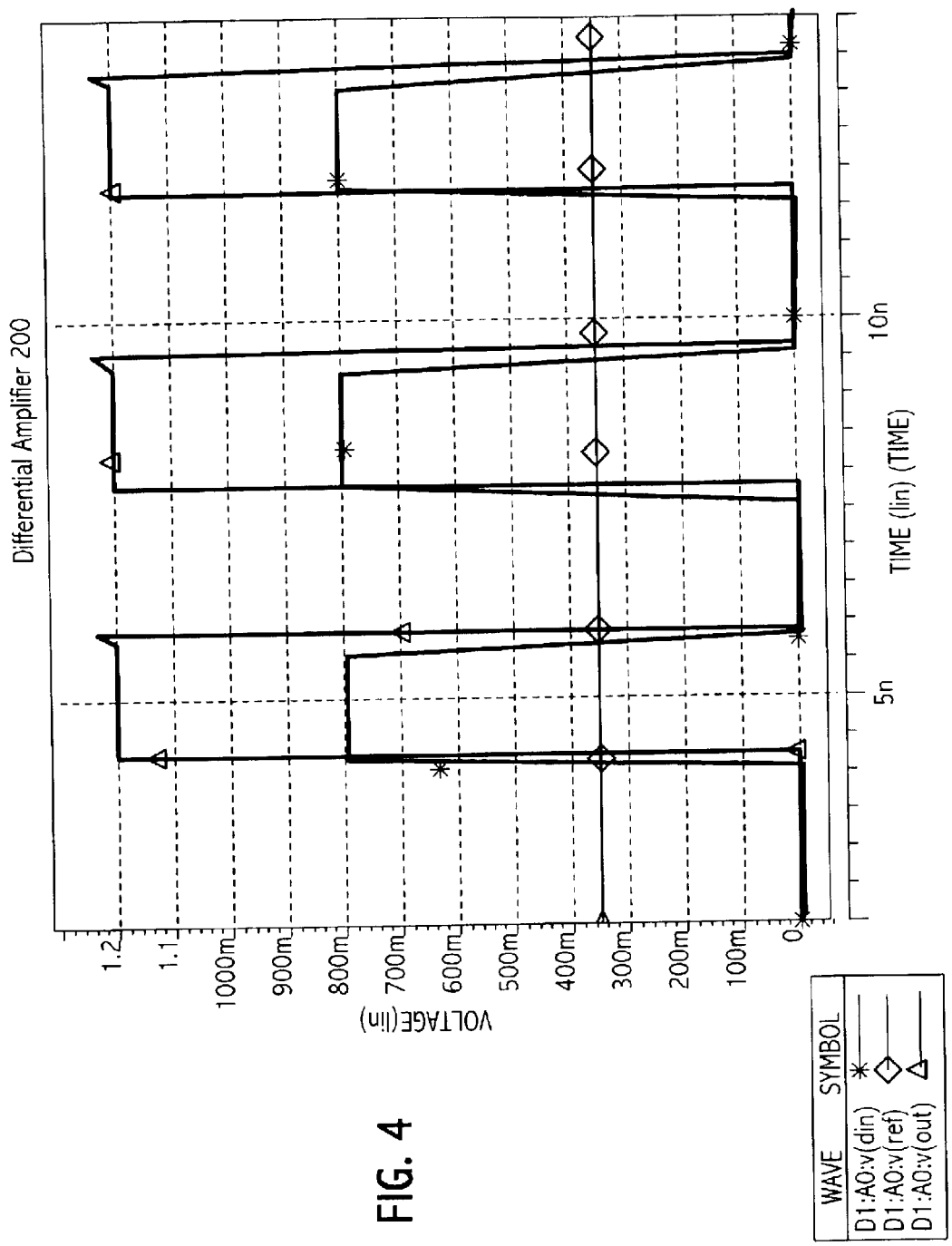
FIG. 4 illustrates a waveform of the operation of an exemplary differential amplifier.
Figure 5:
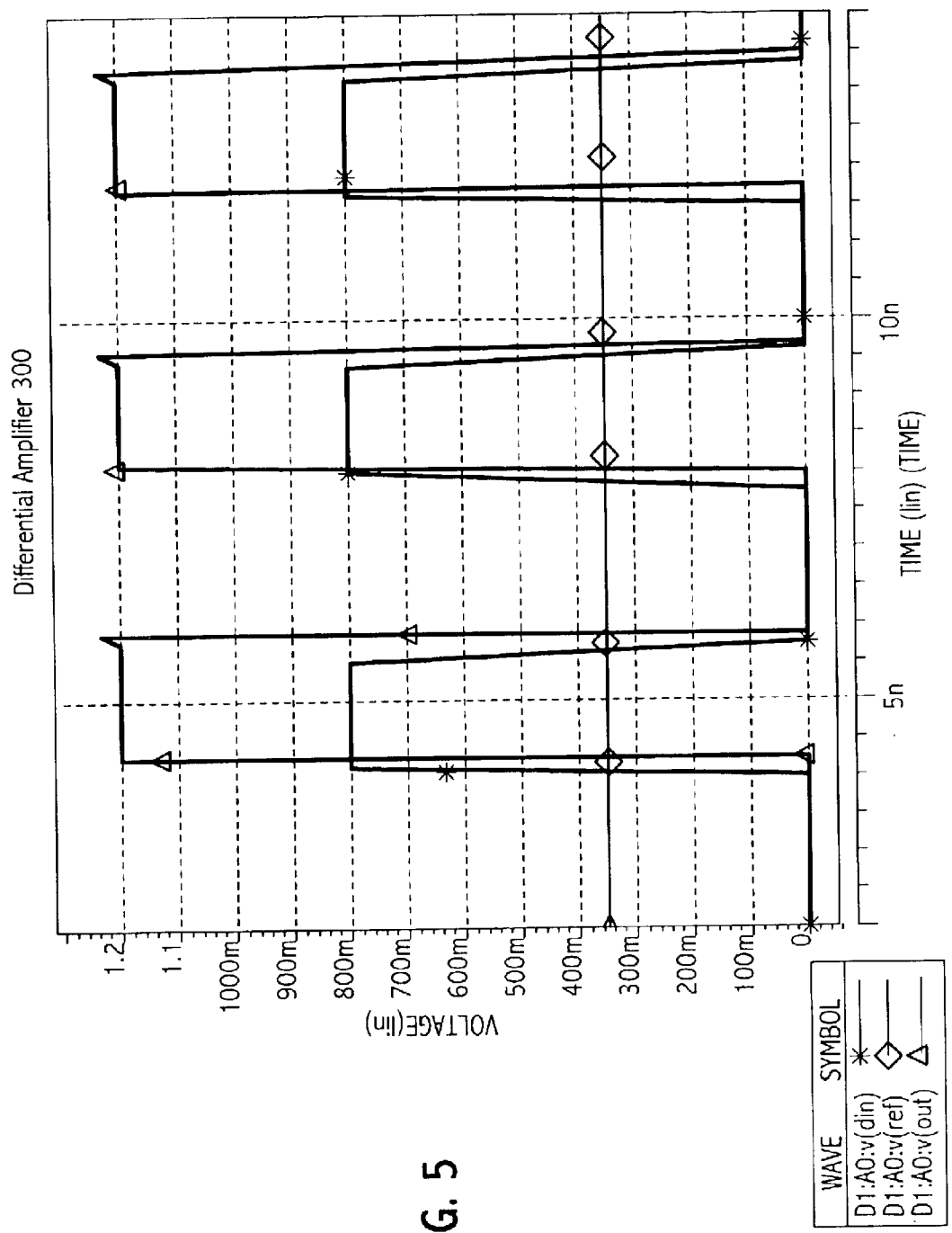
FIG. 5 illustrates a waveform of the operation of a differential amplifier according to an embodiment of the present invention.

FIG. 4 illustrates a waveform of the operation of exemplary differential amplifier 200. FIG. 5 illustrates a waveform of the operation of differential amplifier 300 according to an embodiment of the present invention. As illustrated, the addition of the pull-up structure to differential amplifier 300 has minimal impact on the operation. In particular, the output waveform of differential amplifier 300 is less than one nanosecond delayed from the output waveform of differential amplifier 200.

According to the present invention, an improved differential amplifier allows external input signals to the differential amplifier to be higher voltage than the core voltage of differential amplifier 200, while avoiding gate oxide breakdown and preserving the differential amplifiers functionality. Further, a simpler implementation is provided that uses less transistors and a single power source over prior art differential amplifiers. In addition, the improved differential amplifier uses thin oxide transistors normally only found in the core of an integrated circuit rather than thick oxide transistors normally found in IO cells. Overall, the improved differential amplifier is drastically smaller in layout and is therefore cheaper to manufacture.

Although the present embodiment has been described in relation to a gate oxide breakdown level of 10% greater than the core voltage, gate oxide breakdown levels are semiconductor process dependent. Thus, gate oxide breakdown level is to be understood as the voltage level of a drop across the gate and any other node (drain, source, or bulk) which, when exceeded, causes the gate oxide of the transistor to breakdown.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. An electronic circuit comprising:
   a differential amplifier having a first input terminal, a second input terminal, a first input transistor, and a second input transistor, wherein the first input terminal is coupled to a gate node of the first input transistor and the second input terminal is coupled to the gate node of the second input transistor, and
   a pull-up circuit comprising:
      a first transistor having a source node coupled to a core voltage node;
      a second transistor coupled in series with the first transistor such that a source node of the second transistor is coupled to the drain and gate nodes of the first transistor, and
      a third transactor coupled in series with the first transistor and in parcel with the second transistor such that a source node of the third transistor is coupled to the drain and gate nodes of the first transistor,
      wherein a drain node of the second transistor is coupled to the drain node of the first input transistor and a drain node of the third transistor is coupled to the drain node of the second input transistor.

2. The electronic circuit as recited in claim 1, wherein a gate node of the second transistor is coupled to the drain node of the first input transistor and a gate node of the third transistor is coupled to the drain node of the second input transistor.

3. The electronic circuit as recited in claim 1, wherein the first, second, and third transistors are configured as diodes.

4. The electronic circuit as recited in claim 1, wherein the pull-up circuit is configured to prevent gate oxide breakdown of the first input transistor and the second input transistor.

5. The electronic circuit as recited in claim 1, wherein the pull-up circuit is configured to maintain a voltage drop of less than a gate oxide breakdown level across the first input transistor and the second input transistor.

6. The electronic circuit, as recited in claim 1, wherein the differential amplifier is implemented with thin oxide transistors.

7. The electronic circuit, as recited in claim 1, wherein the differential amplifier is implemented with this oxide transistors having a gate oxide breakdown threshold of 10% greater than a nominal process voltage.

8. The electronic circuit, as recited in claim 1, wherein the electronic circuit is a microprocessor and the differential amplifier is par of an input pad on the microprocessor.

9. A method of making an integrated circuit comprising:
   forming a differential amplifier having a first input terminal, a second input terminal, a first input transistor, and a second input transistor, wherein the first input terminal is coupled to a gate node of the first input transistor and the second input terminal is coupled to the gate node of the second input transistor, and
   forming a pull-up circuit comprising:
      a first transistor having a source node coupled to a core voltage node;
      a second transistor coupled in series with the first transistor such that a source node of the second transistor is coupled to the drain and gate nodes of the first transistor, and
      a third transistor coupled in series with the first transistor and in parallel with the second transistor such that a source node of the third transistor is coupled to the drain and gate nodes of the first transistor,
      wherein a drain node of the second transistor is coupled to the drain node of the first input transistor and a drain node of the third transistor is coupled to the drain node of the second input transistor.

10. The method of making an integrated circuit as recited in claim 9, wherein
    a gate node of the second transistor is coupled to the drain node of the first input transistor and a gate node of the third transistor is coupled to the drain node of the second input transistor.

11. The method of making an integrated circuit as recited in claim 9, wherein the first, second, and third transistors are configured as diodes.

12. The method of making an integrated circuit as recited in claim 9, further comprising:
    configuring the pull-up circuit to prevent gate oxide breakdown of the first input transistor and the second input transistor.

13. The method of making an integrated circuit as recited in claim 9, further comprising:
    configuring the pull-up circuit to maintain a voltage drop of less than a gate oxide breakdown level across the first input transistor and the second input transistor.

14. The method of making an integrated circuit as recited in claim 9, wherein the differential amplifier is implemented with thin oxide transistor.

15. The method of making an integrated circuit as recited in claim 9, wherein the differential amplifier is implemented with thin oxide transistors having a gate oxide breakdown threshold of at least 10% a greater than a nominal process voltage.

16. The method of making an integrated circuit as recited in claim 9, wherein the integrated circuit is a microprocessor and the differential amplifier is part of an input pad on the microprocessor.

17. An integrated circuit comprising:
    first and second input terminals for receiving respective first and second input signals;
    a differential pair of transistors each coupled to a respective one of the first and second input terminals;
    a first bia circuit coupled to the differential pair of transistors for control node voltages associated with the differential pair of transistors when both first and second input signals fall within a first range;
    a second bias circuit coupled to the differential pair of transistors, for limiting, when at least one of the first and second input signals falls outside the first range, a voltage across one or both of the differential pair of transistors to a maximum voltage smaller in magnitude than otherwise allowed to develop by the first bias circuit acting alone; and
    wherein the first bias circuit includes a current mirror.

18. An integrated circuit comprising:
    first and second input terminals for receiving respective first and second input signals;

a differential pair of transistors, each coupled to a respective one of the first and second input terminals;

a first bias circuit coupled to the differential pair of transistors for controlling node voltage associated with the differential pair of transistors when both first and second input signals fall within a first range;

a second bias circuit coupled to the differential pair of transistors or limiting, when at least one of the first and second input signals falls outside the first range, a voltage across one or both of the differential pair of transistors to a maximum voltage smaller in magnitude than otherwise allowed to develop by the first bias circuit acting alone;

wherein the second bias circuit is a voltage limiting circuit; and wherein the voltage limiting circuit includes a current source coupled in series to a first and second diode-connected transistor, the first diode-connected transistor coupled in parallel to the second diode-connected transistor.

19. An integrated circuit comprising:

first and second input terminals for receiving respective first and second input signals;

a differential pair of transistors, each coupled to a respective one of the first and second input terminals;

a first bias circuit coupled to the differential pair of transistors for controlling node voltages associated with the differential pair of transistors when both first and second input signals fall within a first range;

a second bias circuit coupled to the differential pair of transistors, for limiting when at least one of the first and second input signals falls outside the first range, a voltage across one or both of the differential pair of transistors to a maximum voltage smaller in magnitude than otherwise allowed to develop by the first bias circuit acting alone; and wherein the second bias circuit includes a first transistor having a first node coupled to a core voltage node;

a second transistor coupled in series with the first transistor such that a first node of the second transistor is coupled to a second and third node of the first transistor, and a third transistor coupled in series with the first transistor and in parallel with the second transistor such that a first node of the third transistor is coupled to the second and third nodes of the first transistor, wherein a second node of the second transistor is coupled to the second node of the first input transistor and a second node of the third transistor is coupled to the second node of the second input transistor.

20. The integrated circuit of claim 19 wherein the first, second, and third transistors arc configured as diodes.

21. A method comprising:

biasing a differential pair of transistors using a first circuit when a first and second input signal is within a first voltage range;

biasing the differential pair of transistors using the first circuit and a second circuit when at least one of the first and second input signals are within a second voltage range, and wherein the differential pair of transistors are transistors and the second voltage range includes voltages exceeding VDD.

* * * * *

UNITED STATES PATENT AND TRADEMARK OFFICE
CERTIFICATE OF CORRECTION

PATENT NO. : 6,784,729 B1
DATED : August 31, 2004
INVENTOR(S) : Robert A. Glazewski and Norman Bujanos It is certified that error appears in the above-identified patent and that said Letters Patent is hereby corrected as shown below:

Title page,
Item [57], ABSTRACT,
Line 1, "differentail" should read -- differential --

Column 7,
Line 26, the word "transactor" should read -- transistor --.
Line 27, the word "parcel" should read -- parallel --.
Line 53, the word "this" should read -- thin --.
Line 58, the word "par" should read -- part --.

Column 8,
Line 36, the word "transistor" should read -- transistors --.
Line 51, the word "bia" should read -- bias --.
Line 52, the word "control" should read -- controlling --.

Column 9,
Line 8, the words "transistors or limiting" should read -- transistors, for limiting --.

Column 10,
Line 20, the word "transistors" should read -- p-transistors --.

Signed and Sealed this

Fifteenth Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,784,729 B1 Page 1 of 1
APPLICATION NO. : 10/218352
DATED : August 31, 2004
INVENTOR(S) : Robert A. Glazewski and Norman Bujanos It is certified that error appears in the above-identified patent and that said Letters Patent is hereby corrected as shown below:

Title page,
Item [57], ABSTRACT,
Line 1, "differentail" should read -- differential --

Column 7,
Line 26, "transactor" should read -- transistor --.
Line 27, "parcel" should read -- parallel --.
Line 53, "this" should read -- thin --.
Line 58, "par" should read -- part --.

Column 8,
Line 36, "transistor" should read -- transistors --.
Line 51, "bia" should read -- bias --.
Line 52, "control" should read -- controlling --.

Column 9,
Line 8, "transistors or limiting" should read -- transistors, for limiting --.

Column 10,
Line 29, "transistors" should read -- p-transistors --.

This certificate supersedes Certificate of Correction issued February 15, 2005.

Signed and Sealed this

Twenty-seventh Day of June, 2006

JON W. DUDAS
*Director of the United States Patent and Trademark Office*